United States Patent [19]

Yeh

[11] Patent Number: 4,984,124

[45] Date of Patent: Jan. 8, 1991

[54] FAULTED CURRENT INDICATOR WITH INRUSH RESTRAINT

[75] Inventor: Thomas Yeh, South Weymouth, Mass.

[73] Assignee: Sigma Instruments, Inc., Weymouth, Mass.

[21] Appl. No.: 374,215

[22] Filed: Jun. 30, 1989

[51] Int. Cl.$^5$ ............................................... H02H 3/08
[52] U.S. Cl. ......................................... 361/59; 361/93; 361/96
[58] Field of Search .................... 361/59, 93, 94, 95, 361/96, 97; 340/664

[56] References Cited

U.S. PATENT DOCUMENTS 3,715,742  2/1973  Schweitzer, Jr. ............... 361/59 X
4,733,321  3/1988  Lindeporg ........................ 361/96

*Primary Examiner*—Derek S. Jennings
*Attorney, Agent, or Firm*—Stanger, Michaelson, Spivak & Wallace

[57] ABSTRACT

The disclosed faulted current indicator senses current in a line having a breaker or fuse, and avoids tripping in response to current inrush signals by producing a trip signal in response to an overcurrent occurring for an overcurrent duration which is inversely related to the magnitude of the overcurrent and is faster than the overcurrent operating time of the breaker or fuse. In one embodiment, this involves operating a current protection device in response to an overcurrent occurring for a second overcurrent duration inversely related to the magnitude of the overcurrent according to a first characteristic, and adjusting the first overcurrent duration to follow a second characteristic having variations substantially the same as the first characteristic but having a shorter first overcurrent duration than the second overcurrent duration.

14 Claims, 3 Drawing Sheets

INRUSH RESTRAINT METHOD 4
TIME-OVERCURRENT CURVES

FAULTED CURRENT INDICATOR WITH INRUSH RESTRAINT

RELATED APPLICATIONS

This application is related to the copending U.S. patent application of Thomas Yeh and Joseph R. Thibodeau, Ser. No. 362,063, filed June 6, 1989 now abandoned, and to the application of Thomas Yeh and Joseph R, Thibodeau being filed concurrently herewith (SIG-220), both assigned to the assignee of this application.

BACKGROUND OF THE INVENTION:

This invention relates to faulted current indicators, and particularly to methods and means for displaying a faulted current condition while ignoring high inrush currents.

Faulted current indicators (or FCI's or fault indicators) are placed at intervals along power lines to disclose that a fault has occurred between the indicator and a load. In general, each FCI trips in response to an overcurrent that occurs as a result of a fault between the indicator and the load. The FCI remains in the trip indicating condition even after a current protection device, such as a circuit breaker or a fuse, in the line has responded to the overcurrent by opening the line and ending the current in the line. After the fault has been cured and the current protection device closed to re-energize the line, the FCI resets in response to a minimum operating current. Such devices often respond unintentionally to energization inrush currents and therefore frequently provide inaccurate information.

Attempts to have FCI's disregard inrush currents have had limited success because they required extended outages for operation and were unable to ignore long term inrushes. The devices described in the aforementioned application overcome such disadvantages by disabling the trip operation in response to inrush currents that occur immediately upon energization. However, such devices depend upon a minimum operating current to initiate the inrush restraint. If the minimum current does not occur until after the inrush current time has passed, the FCI may mistake an actual fault overcurrent for an inrush current and thereby fail to trip.

OBJECTS AND SUMMARY OF THE INVENTION

An object of the invention is to overcome these difficulties.

Another object of the invention is to furnish more reliable trip operations while ignoring inrushes.

According to a feature of the invention, these objects are achieved, in whole or in part, by sensing the current in the line and producing a trip signal in response to an overcurrent occurring for a time inversely related to the magnitude of the overcurrent.

According to another feature of the invention, the step of producing the trip signal includes operating a current protection device in response to an overcurrent occurring for a second overcurrent duration inversely related to the magnitude of the overcurrent according to a first characteristic, and adjusting the first overcurrent duration to follow a second characteristic having variations substantially the same as the first characteristic but having a shorter first overcurrent duration than the second overcurrent duration. Thus the FCI trip operation follows a characteristic substantially close to the characteristic of the current protection device which controls the current in the line.

These and other features of the invention are pointed out in the claims. Other objects and advantages of the invention will become evident from the following detailed description of preferred embodiments when read in light of the following drawings.

DETAILED DESCRIPTION OF PREFERRED EMBODIMENTS

Figure 1:
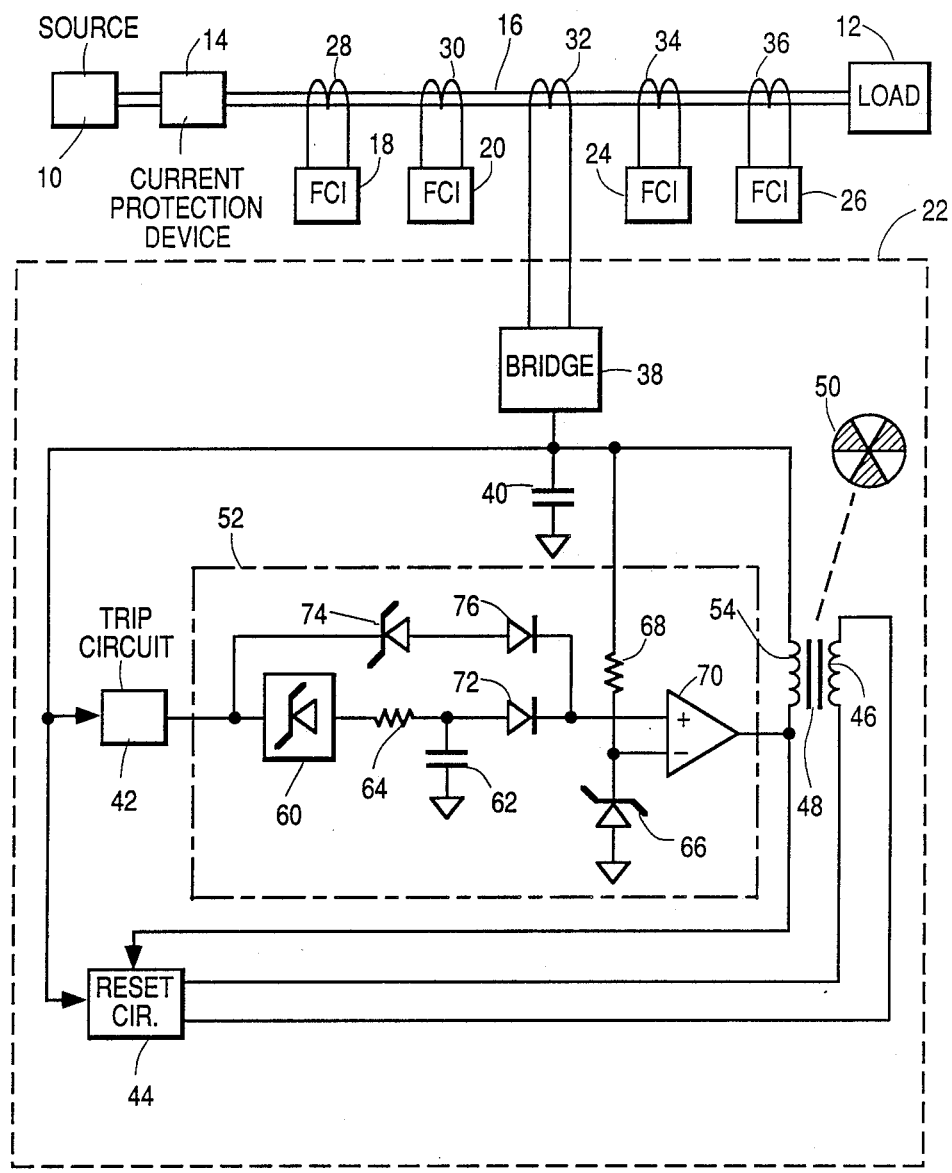
FIG. 1 is a block diagram illustrating an embodiment of the invention.

FIG. 1 illustrates the invention and its environment. In FIG. 1 a power source 10 energizes a load 12 through a current protection device 14, such as a circuit breaker or a fuse, and a power cable 16. The term cable is being used herein in a generic sense to include current carrying conductor or phase conductor in a power distribution line. Faulted circuit indicators (FCI's) 18, 20, 22, 24, and 26, inductively coupled to the cable 16 by inductive sensors 28, 30, 32, 34, and 36 at spaced locations along the cable, sense whether a fault exits at positions between any FCI's. A fault between FCI 24 and FCI 26 causes high current to trip FCI's 18 to 24 while leaving FCI 26 reset. This identifies the location of the fault as being between FCI 24 and FCI 26. The length of the cable 16 appears shortened for purposes of illustration. Although only FCI 22 is shown in detail, it will be understood that the other FCI's are identical thereto.

The inductive sensors 28 to 36 produce respective alternating voltages corresponding in amplitude to the amplitude of the alternating currents they sense in the cable 16. In the FCI 22, a bridge circuit 38 rectifies the sensed alternating voltage to form a direct current waveform and a capacitor 40 captures the peak value of the rectified voltage. The voltage across the capacitor 40 is now proportional to the current flowing in the power cable 16. A trip circuit 42 and a reset circuit 44 operate on the basis of the voltage across the capacitor 40. The trip circuit 42 is set to produce a trip signal when the voltage across the capacitor 40 exceeds a trip voltage Vtrip to indicate that the current in the cable 16 is beyond a trip current Itrip.

The inductive sensor 32, the bridge circuit 38 and the capacitor 40 together serve the dual role of providing the signal proportional to current in the power cable 16 and of furnishing the energy necessary to operate the circuits 42 and 44 of the FCI. According to another embodiment of the invention, a reed switch placed in the electromagnetic field of the power cable 16 gives an indication of excess current and an inductive current sensor, bridge, and capacitor supply the necessary energy. According to still another embodiment, other energy sources such as a battery replace the current sensor, bridge, and capacitor combination.

The reset circuit 44 produces a reset signal in response to a minimum potential Vmin appearing across the capacitor 40, and corresponding to a minimum current Imin in the cable 16. The reset signal energizes a reset winding 46 of an electromagnetic fault display activator 48 which drives a target 50 into a reset position.

An inrush restraint circuit 52 passes the trip signal from the trip circuit 42 to a trip winding 54 in the driver 48. At the same time, the circuit 52 feeds back the trip signal to the reset circuit 44 to inhibit the reset operation during the trip action.

The inrush restraint circuit 52 receives an input voltage only when the voltage across the capacitor 40 indicates that the current in the line 16 has passed beyond a trip level into an overcurrent condition. In the circuit 52, a circuit element 60 functions as a Zener diode and furnishes the threshold of a time-overcurrent curve. Once the current in the power line 16 goes into an overcurrent condition, the sensor 32 develops sufficient voltage across the sense capacitor 40 to bias the element 60, and a capacitor 62 begins to charge through a resistor 64. When the voltage across the capacitor 62 reaches a level higher than that established by a Zener diode 66 and a resistor 68 at the reference input of a comparator 70, a diode 72 causes the comparator 70 to apply a pulse through the trip winding 52 and turn the target 50 to the trip condition.

The greater the overcurrent in the power cable 16, the higher the voltage of the sense capacitor 40, and the more rapidly the capacitor 62 charges.

A Zener diode 74 and a diode 76 bypass the RC combination of resistors 64 and capacitors 62 if current in the cable 16 is sufficiently high to exceed a high threshold. At that point the trip circuit causes the comparator 70 to trip the indicator 48 instantaneously and turn the target 50 to the trip position.

Figure 2:
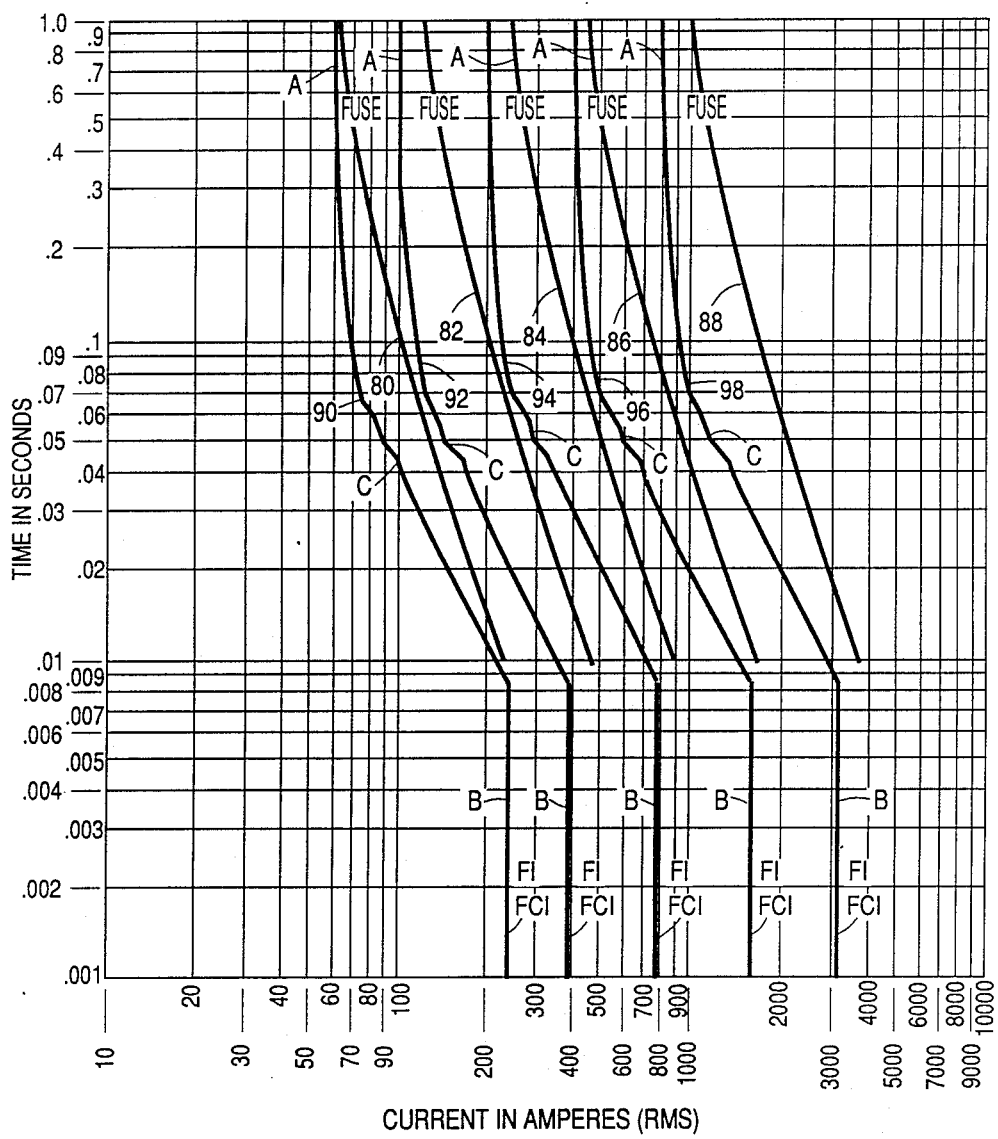
FIG. 2 is a graph illustrating the characteristics of the circuit in FIG. 1.

FIG. 2 illustrates characteristics of protection devices 14 such as fuses and fault indicators according to the invention. In the graph of FIG. 2, protection device time-overcurrent curves 80, 82, 84, 86, and 88 illustrate the amount of time it takes a commercial current protection device 14 to open in response to a particular current. Thus, a protection device having a characteristic shown by the curve 80 opens after 0.5 seconds in response to a current of 70 amperes. On the other hand, a current of 220 amperes will open the same protection device in 0.01 seconds. With respect to a protection device characterized by the curve 88, this protection device requires carrying a current of 1000 amperes for 1 full second in order to open. It opens within 0.1 second in response to 3800 amperes.

The curves 90, 92, 94, 96, and 98 follow a profile established by the circuit 42 and the inrush restraint circuit 52 slightly to the left of the curves 80 to 88. The upper ends A of each of the curves is established by circuit 42 and represents the minimum cable current to which the FCI 22 can respond no matter how long the overcurrent duration. The lower portions B respond virtually instantaneously as determined by the zener diode 74 and diode 76 together with the trip circuit 42. The intermediate diagonally curved portions C follow their profile on the basis of the operation of the trip circuit 42, the Zener diode 60, the resistor 64, the capacitor 62, and the diode 72. The greater the overcurrent in the power cable, the higher the voltage at capacitor 40 and the faster the charge of the capacitor 62.

This arrangement selects the trip setting of each time-overcurrent fault indicator 18 to 26 to coordinate its profile to that of the line protection device 14. It selects the trip curve of the fault indicator 18 to 26 just to the left side of the trip curve of the protection device 14. This insures proper coordination in the operation of the fault indicator with that of the protection device. Only a true fault generates time-current magnitudes that lie to the right side of the trip curve and caused the fault indicator to operate to trip.

Figure 3:
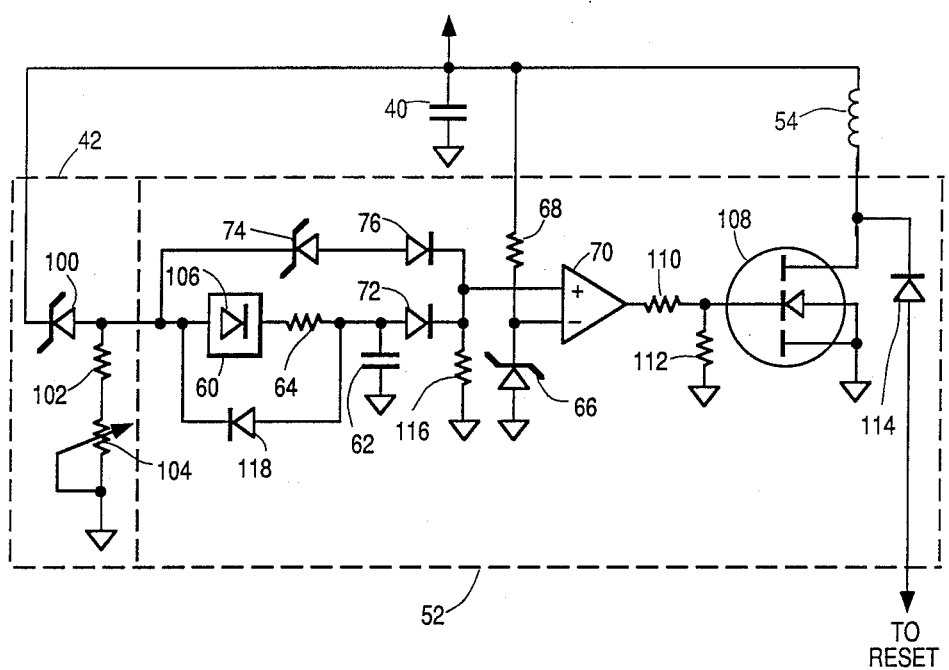
FIG. 3 is a circuit diagram illustrating details of part of the circuitry in FIG. 1.

FIG. 3 illustrates details of the trip circuit 42 and the inrush restraint circuit 52. In FIG. 3, parts corresponding to those in FIG. 1 are designated with like reference characters. In the trip circuit a Zener diode 100, a resistor 102, and a variable resistor 104 establish a nominal trip potential.

In the inrush restraint circuit 52 the element 60 is now in the form of a forward diode 106 that operates like a Zener diode with a very low biasing potential such as 0.6 volts. The forward diode 106 is used in lieu of a Zener diode to achieve the low biasing potential. The element 60, together with the trip circuit 42, establis the threshold of the overcurrent in each time-overcurrent curve at the end A. Once the current in the cable 16 develops sufficient voltage across the capacitor 40 so that the output at the Zener diode 100 biases the element 60, the capacitor 62 charges through the resistor 64. When sufficient charge accumulates across the capacitor 62 to overcome the effect of the Zener diode 66, the diode 72 causes the comparator 72 to apply a pulse to a field effect transistor 108 via resistors 110 and 112. The transistor 108 then conducts and passes trip current through the trip winding 54.

In the inrush restraint circuit 52, the Zener diode 66 and the resistor 68 form a noise rejection circuit and a threshold for sharpening the pulse to the field effect transistor 108. A diode 114 feeds the trip signal to disable the reset circuit 44. A resistor 116 serves as a tiedown resistor. A diode 118 discharges capacitor 62 after each over current.

While embodiments of the invention have been described in detail, it will be evident that the invention may be embodied otherwise.

What is claimed is:

1. A faulted current indicator for a cable which includes a circuit breaking device that opens in response to a first overcurrent occurring for a first overcurrent duration, comprising:
    sensing means for responding to current in the cable;
    reset means responsive to said sensing means for producing reset signals; and
    trip means coupled to said sensing means for producing a trip signal in response to a second overcurrent occurring for a second overcurrent duration, said second overcurrent duration being inversely related to the magnitude of the second overcurrent and shorter than the first overcurrent duration.

2. An indicator as in claim 1, wherein said trip means includes:
    a voltage responsive delay circuit for delaying the trip signal for a time inversely related to the magnitude of the overcurrent.

3. An indicator as in claim 1, wherein said trip means includes:
    a voltage responsive delay circuit for delaying the trip signal for a time inversely related to the magnitude of the overcurrent; and
    minimum overcurrent setting means coupled to said delay means for setting a minimum overcurrent signal so that said delay circuit responds only to overcurrent signals.

4. An indicator as in claim 1, wherein said trip means includes:

a voltage responsive delay circuit for delaying the trip signal for a time inversely related to the magnitude of the second overcurrent; and override means for overriding the delay circuit and producing a trip signal without delay when the overcurrent reaches a predetermined value.

5. An indicator as in claim 1, wherein said trip means includes:

a voltage responsive delay circuit for delaying the trip signal for a time inversely related to the magnitude of an overcurrent;

minimum overcurrent setting means coupled to said delay means for setting a minimum second overcurrent signal so that said delay circuit responds only to second overcurrent signals; and override means for overriding the delay circuit and producing a trip signal without delay when the second overcurrent reaches a predetermined value.

6. An indicator as in claim 1, wherein said trip means includes:

first circuit means for producing the trip signal in response to an overcurrent occurring for a second overcurrent duration inversely related to the magnitude of the second overcurrent when the magnitude of the second overcurrent remains below a predetermined value; and second circuit means for producing a trip signal immediately in response to an overcurrent which exceeds the predetermined value.

7. An indicator as in claim 1, wherein:

the circuit breaking device which opens in response to the first overcurrent occurring for the first overcurrent duration inversely related to the magnitude of the overcurrent according to a first characteristic; and the second overcurrent duration of said trip means follows a second characteristic having variations substantially the same as the first characteristic but having shorter second overcurrent durations than the first overcurrent durations.

8. An indicator as in claim 1, wherein:

the circuit breaking device in the cable opens in response to an overcurrent occurring for a second overcurrent duration inversely related to the magnitude of the overcurrent; and wherein said trip means includes:

a voltage responsive delay circuit for delaying the trip signal for a time inversely related to the magnitude of the second overcurrent so that the second overcurrent duration is shorter than the first overcurrent duration.

9. An indicator as in claim 1, wherein said trip means includes:

a voltage responsive delay circuit for delaying the trip signal for a time inversely related to the magnitude of the second overcurrent so that the second overcurrent duration is shorter than the first overcurrent duration; and minimum overcurrent setting means coupled to said delay means for setting a minimum overcurrent signal so that said delay circuit responds only to overcurrent signals.

10. An indicator as in claim 1, wherein said trip means includes:

a voltage responsive delay circuit for delaying the trip signal or a time inversely related to the magnitude of the overcurrent so that the second overcurrent duration is shorter than the first overcurrent duration; and override means for overriding the delay circuit and producing a trip signal without delay when the overcurrent reaches a predetermined value.

11. An indicator as in claim 1, wherein said trip means includes:

a voltage responsive delay circuit for delaying the trip signal for a time inversely related to the magnitude of the overcurrent so that the second overcurrent duration is shorter than the first overcurrent duration;

minimum overcurrent setting means coupled to said delay means for setting a minimum overcurrent signal so that said delay circuit responds only to overcurrent signals; and override means for overriding the delay circuit and producing a trip signal without delay when the overcurrent reaches a predetermined value.

12. An indicator as in claim 1, wherein said trip means includes:

first circuit means for producing the trip signal in response to an overcurrent occurring for the second overcurrent duration inversely related to the magnitude of the second overcurrent when the magnitude of the overcurrent remains below a predetermined value;

a voltage responsive delay circuit in said first circuit means for delaying the trip signal for a time inversely related to the magnitude of the overcurrent so that the second overcurrent duration is shorter than the first overcurrent duration; and second circuit means for producing a trip signal immediately in response to an overcurrent which exceeds the predetermined value.

13. A method of indicating a faulted current in a line, comprising:

operating a current protection device in response to a first overcurrent occurring for a first overcurrent duration inversely related to the magnitude of the first overcurrent according to a first characteristic;

sensing current in the line;

producing a trip signal in response to a second overcurrent occurring for a second overcurrent duration inversely related to the magnitude of the second overcurrent according to a second characteristic having variations substantially the same as the first characteristic but having a shorter second overcurrent duration than the first overcurrent duration.

14. An indicator as in claim 1, wherein said trip means responds immediately to the second overcurrent if the second overcurrent exceeds a predetermined value higher than a given value.

* * * * *